(12) United States Patent
Miyazaki

(10) Patent No.: US 7,456,649 B2
(45) Date of Patent: Nov. 25, 2008

(54) OPEN DRAIN OUTPUT CIRCUIT

(75) Inventor: Hiroshi Miyazaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/633,454

(22) Filed: Dec. 5, 2006

(65) Prior Publication Data
US 2007/0247192 A1 Oct. 25, 2007

(30) Foreign Application Priority Data
Mar. 28, 2006 (JP) ............................. 2006-088450

(51) Int. Cl.
*H03K 17/16* (2006.01)
*H03K 19/003* (2006.01)
(52) U.S. Cl. .............................. 326/27; 326/26; 326/83
(58) Field of Classification Search ............. 326/26–27, 326/30–34
See application file for complete search history.

(56) References Cited

U.S. PATENT DOCUMENTS 6,222,403 B1 * 4/2001 Mitsuda ...................... 327/170

2001/0026178 A1 * 10/2001 Itoh et al. .................... 327/112

FOREIGN PATENT DOCUMENTS

| JP | 7-30399 A | 1/1995 |
| JP | 11-274909 A | 10/1999 |
| JP | 11-346147 A | 12/1999 |
| JP | 2004-266494 A | 9/2004 |

* cited by examiner

*Primary Examiner*—Anh Q Tran
(74) *Attorney, Agent, or Firm*—Arent Fox LLP

(57) ABSTRACT

An open drain output circuit for use as an $I^2C$ bus interface. The open drain output circuit includes an output terminal. An input unit performs a first operation causing the potential at the output node to steeply fall and a second operation for gradually raising the potential in accordance with transition of an input signal. An output transistor connected to the output node of the input unit and the output terminal is turned OFF in the first operation and turned ON in the second operation. A delay time adjustment circuit reduces the difference between a delay time from transition of the input signal until when the output transistor is turned OFF in the first operation and a delay time from transition of the input signal until when the output transistor is turned ON in the second operation.

13 Claims, 10 Drawing Sheets

OPEN DRAIN OUTPUT CIRCUIT

CROSS-REFERENCE TO RELATED APPLICATIONS

This application is based upon and claims the benefit of priority from prior Japanese Patent Application No. 2006-088450, filed on Mar. 28, 2006, the entire contents of which are incorporated herein by reference.

BACKGROUND OF THE INVENTION

The present invention relates to an open drain output circuit.

An $I^2C$ (Inter-Integrated Circuit) bus interface includes a control macro and an I/O circuit. An open drain output circuit is used as the I/O circuit. The $I^2C$ bus has a predetermined standard related to the delay characteristic of the output signal. Therefore, a stable $I^2C$ bus interface must be configured with the output property of the open drain output circuit conforming to the standard.

FIG. 1 shows one example of the $I^2C$ bus interface. The $I^2C$ bus interface includes a control macro 1 and I/O circuits 2a and 2b. In accordance with DATA (SDA) and CLOCK (SCL) output from the control macro 1, the transmission of DATA is performed.

FIG. 2 shows one example of an input/output signal transition in the I/O circuits 2a and 2b. Input signals DATA IN and CLOCK IN are respectively provided to the I/O circuits 2a and 2b. Then, the I/O circuits 2a and 2b respectively generate output signals DATA OUT and CLOCK OUT based on the predetermined delay characteristic. In the example of FIG. 2, the input signals DATA IN and CLOCK IN of the I/O circuits 2a and 2b have opposite phases. The output signals DATA OUT and CLOCK OUT also have opposite phases.

The input signals DATA IN and CLOCK IN are provided to the I/O circuits 2a and 2b as synchronous signals. The output signals DATA OUT and CLOCK OUT are set so that the output signal DATA OUT rises to an H level after the output signal CLOCK OUT falls to an L level due to the delay characteristic of the I/O circuits 2a and 2b based on the standard of the $I^2C$ bus interface.

A predetermined gradient is set for the falling characteristic of the output signal CLOCK OUT and for the rising characteristic of the output signal DATA OUT.

FIG. 3 shows a conventional open drain output circuit 100 used as an output circuit of the I/O circuits 2a and 2b. An input signal IN is provided via a buffer circuit 3 to the gates of the transistors Tr1 and Tr2, which configure an inverter circuit 4. The transistor Tr1 has a source connected to a power supply Vcc by way of a resistor R1. The transistor Tr2 has a source connected to ground GND.

The output node N1 of the inverter circuit 4 is connected to the gate of an output transistor Tr3 (N-channel MOS transistor). The output transistor Tr3 has a drain, connected to an output terminal To, and a source, connected to the ground GND. A capacitor C1 is connected between the drain and gate of the output transistor Tr3.

The output terminal To is connected to a bus. A terminal resistor R2 is connected between the bus and the power supply Vcc. A bus capacitor C2 (sum of wiring capacitance and input capacitance of other LSIs etc. mounted on a circuit board) is connected between the bus and the ground GND.

In the open drain output circuit 100, the node N1 falls from an H level to an L level (first operation) when the input signal IN rises from an L level to an H level, as shown in FIG. 4. The output transistor Tr3 is then turned OFF and the output terminal To is set to a high impedance state. Thus, an output signal Vout generated at the output terminal To gradually rises from an L level to an H level in accordance with the time constant determined by the terminal resistor R2 and the bus capacitor C2.

Next, the potential at the node N1 gradually rises from an L level to an H level (second operation) when the input signal IN falls from an H level to an L level. This is because the drain current of the transistor Tr1 is restricted by the resistor R1.

When the potential at the node N1 reaches a threshold value of the output transistor Tr3, the output transistor Tr3 is turned ON, the drain current of the output transistor Tr3 gradually increases as the potential at the node N1 rises, and the output signal Vout gradually decreases. The gradient of the output signal Vout is set so as to comply with the standard of the $I^2C$ bus interface through adjustment of the resistance of the resistor R1 and the capacitance of the capacitor C1.

Japanese Laid-Open Patent Publication No. 11-346147 discloses a through rate output circuit for shortening the delay time of the output signal with respect to the input signal while having a through rate function for making the rise and fall of the output signal gradual.

Japanese Laid-Open Patent Publication No. 7-30399 discloses an open drain output circuit in which the gradient for the fall of the output signal is adjustable.

Japanese Laid-Open Patent Publication No. 11-274909 discloses an open drain output circuit in which the gradients of the fall and the rise of the output signal are adjustable.

Japanese Laid-Open Patent Publication No. 2004-266494 discloses a configuration for reducing the power consumption of the open drain output circuit.

SUMMARY OF THE INVENTION

In the open drain output circuit 100, the delay time t1 from the fall of the input signal IN to when the output transistor Tr3 starts to fall increases when the gradient for the fall of the output signal Vout is set to be sufficiently gradual.

Since the open drain output circuit 100 does not include an adjusting means for the rising characteristic of the output signal Vout, the output signal Vout immediately starts to rise when the input signal IN rises to an H level. Therefore, the delay time t2 from the rise of the input signal IN to when the output signal Vout starts to rise is shorter than the delay time t1.

The time width of the output signal Vout at an H level becomes longer than that at an L level even if the time width of the input signal IN is the same at an H level and an L level.

Therefore, when such an open drain output circuit 100 is used for the I/O circuits 2a and 2b shown in FIG. 1, the output signal DATA OUT rises to an H level before the output signal CLOCK OUT falls to an L level even if the input signal DATA IN is synchronized with the input signal CLOCK IN. This results in a bus error.

The present invention provides an open drain output circuit capable of generating the output signal in which the delay with respect to the rise transition of the input signal substantially matches the delay with respect to the fall transition of the input signal while having the falling characteristic and the rising characteristic of the output signal comply with the $I^2C$ bus interface standard. Such an open drain output circuit is optimal for use as the $I^2C$ bus interface.

One aspect of the present invention provides an open drain output circuit including an output terminal. The open drain output circuit includes an input unit for receiving an input signal. The input unit includes an output node and performs a first operation and a second operation in accordance with transition of the input signal. The first operation causes the potential at the output node to steeply fall and the second operation causes the potential at the output node to gradually rise. An output transistor has a gate connected to the output node of the input unit and a drain connected to the output terminal. The output transistor is turned OFF in the first operation of the input unit and turned ON in the second operation. The input unit includes a delay time adjustment circuit for reducing the difference between a delay time from the transition of the input signal until when the output transistor is turned OFF in the first operation and a delay time from the transition of the input signal until when the output transistor is turned ON in the second operation.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
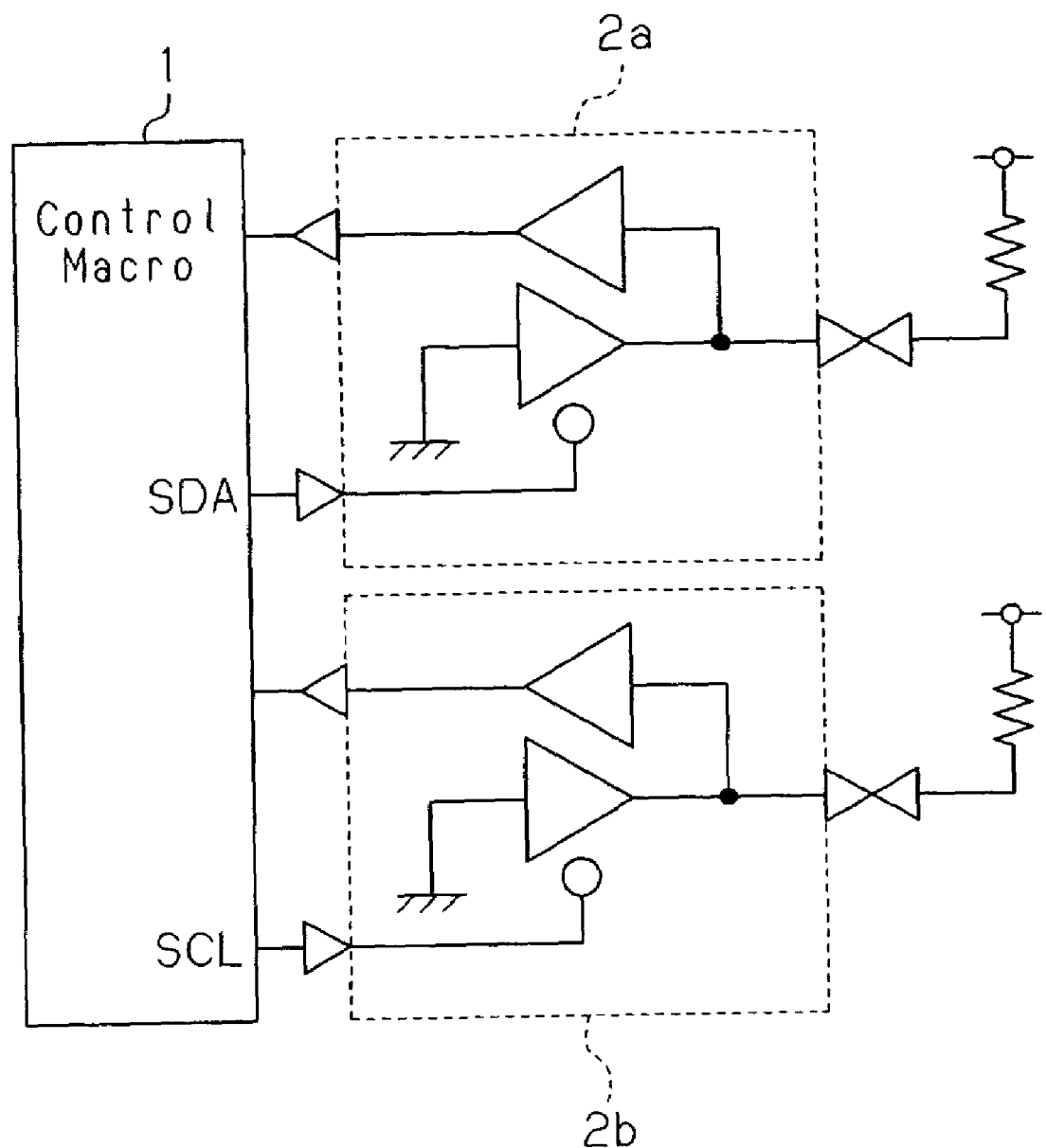
FIG. 1 is a schematic circuit diagram showing an I²C bus interface.
Figure 2:
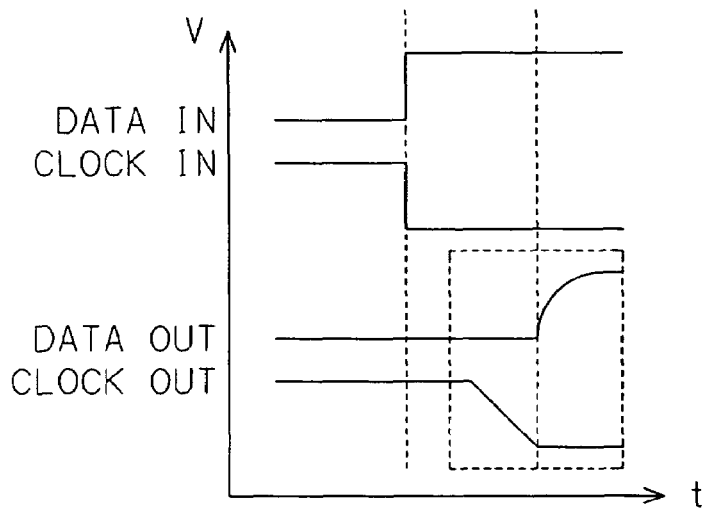
FIG. 2 is a timing waveform chart showing the operation of the I²C bus interface.

In the drawings, like numeral are used for like elements throughout.

Figure 3:
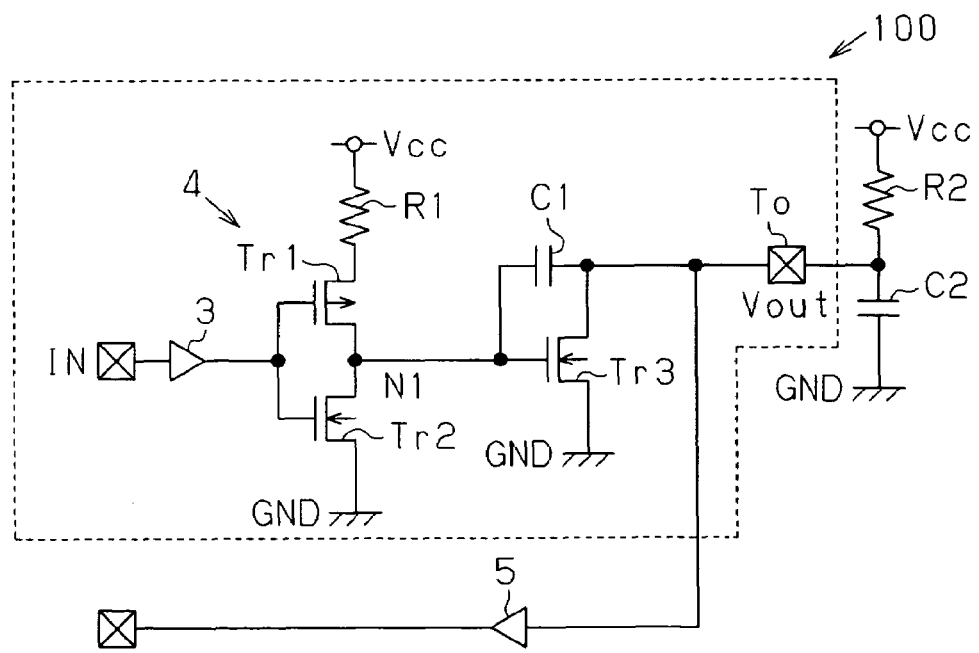
FIG. 3 is a schematic circuit diagram showing an open drain output circuit in the prior art.
Figure 4:
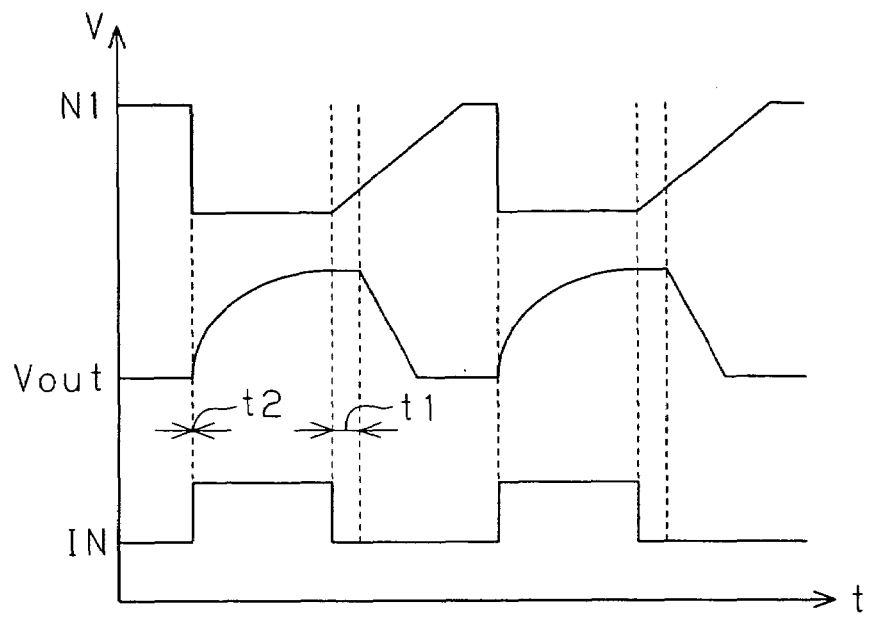
FIG. 4 is a timing waveform chart showing the operation of the open drain output circuit in the prior art.
Figure 5:
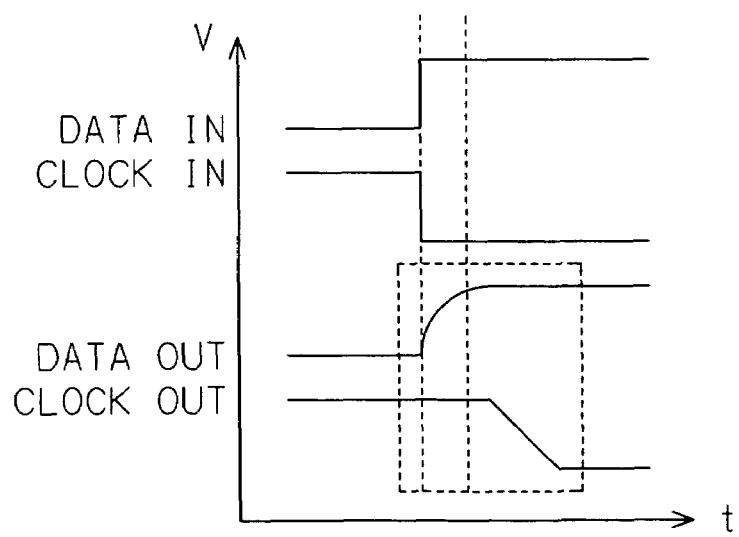
FIG. 5 is a timing waveform chart showing the operation of the I²C bus interface in the prior art.
Figure 6:
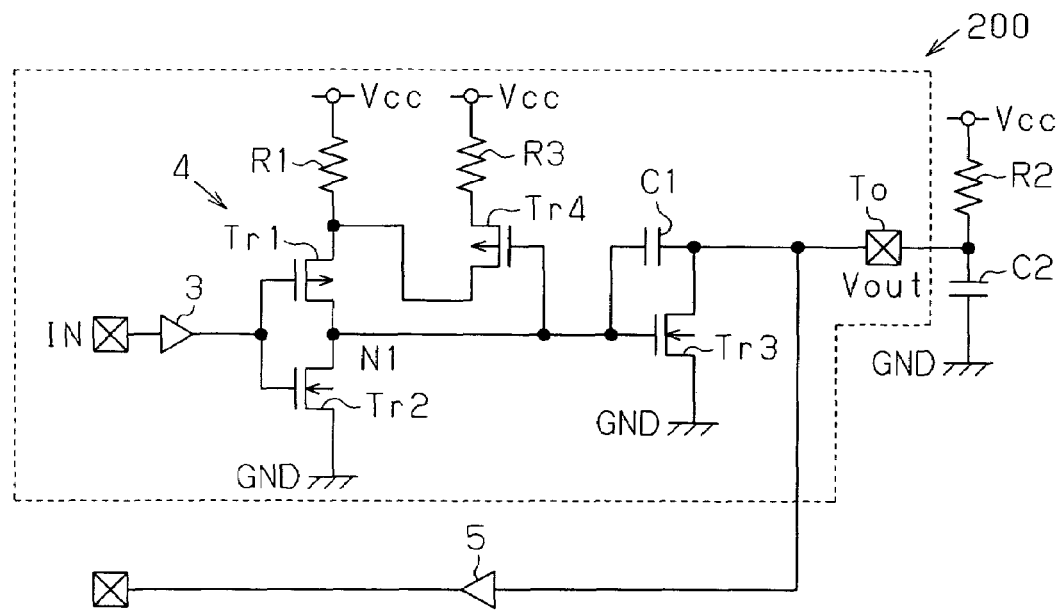
FIG. 6 is a schematic circuit diagram showing an open drain output circuit according to a first embodiment of the present invention.

FIG. 6 shows an open drain output circuit 200 according to a first embodiment embodying the present invention. The open drain output circuit 200 of the first embodiment has the configuration of the conventional open drain output circuit 100 shown in FIG. 3. In addition, the open drain output circuit 200 includes a resistor R3 and a transistor Tr4 (P-channel MOS transistor), which form a first delay time adjustment circuit.

The transistor Tr4 has a source connected to the power supply Vcc via the resistor R3 and a drain connected to the source of the transistor Tr1, which configures the first inverter circuit 4 serving as an input unit. The resistance of the resistor R3 is set sufficiently to be smaller than the resistance of the resistor R1. For example, the resistor R1 is 300 kΩ, and the resistor R3 is 100 kΩ. Therefore, the drain current flowing through the transistor Tr4 is greater than that flowing through the transistor Tr1.

The output terminal To is connected to the input terminal of the input buffer circuit 5, and the output terminal of the input buffer circuit 5 is connected to the control macro 1, which is shown in FIG. 1. The signal is provided from the bus to the control macro 1 via the input buffer circuit 5.

Figure 7:
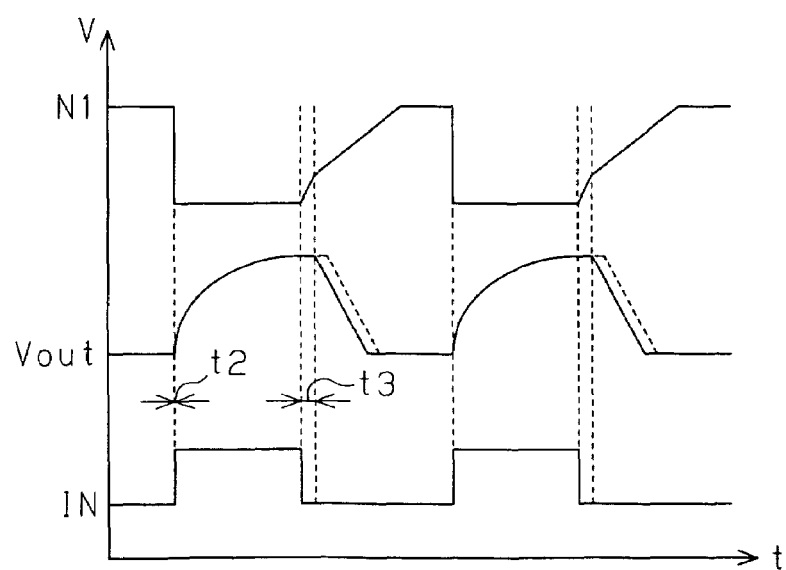
FIG. 7 is a timing waveform chart showing the operation of the open drain output circuit in the first embodiment.

The operation of the open drain output circuit 200 will now be described with reference to FIG. 7. The potential at the node N1 falls from an H level to an L level when the input signal IN rises from an L level to an H level. This turns OFF the output transistor Tr3 and sets the output terminal To in a high impedance state. Thus, the output signal Vout at the output terminal To gradually rises from an L level to an H level in accordance with the time constant determined by the terminal resistor R2 and the bus capacitor C2.

In this state, the transistor Tr4 is turned ON. However, the potential at the node N1 is maintained at an L level since the transistor Tr1 of the inverter circuit 4 is turned OFF.

When the input signal IN falls from an H level to an L level and the transistor Tr1 is turned ON, the drain current of the transistor Tr4 is supplied to the transistor Tr1. Further, the potential at the node N1 rises relatively steeply.

The output transistor Tr3 is then turned ON by the rise in the potential at the node N1, and the output signal Vout gradually falls from an H level to an L level. The transistor Tr4 is turned OFF at substantially the same timing as when the output transistor Tr3 is turned ON.

Therefore, after the transistor Tr4 is turned OFF, the potential at the node N1 gradually rises in accordance with the drain current of the transistor Tr1, the drain current (output current) of the output transistor Tr3 increases, and the output signal Vout gradually falls from an H level to an L level.

The open drain output circuit 200 of the first embodiment has the advantages described below.

(1) When the input signal IN falls from an H level to an L level, the operation of the resistor R3 and the transistor Tr4 (first current supply circuit) cause the potential at the node N1 to start rising with a steep gradient. This shortens the delay time t3 from the fall of the input signal until the output transistor Tr3 is turned ON. The time width of the output signal Vout at an H level in the open drain output circuit 200 of the present embodiment is shorter than the time width of the output signal Vout in the conventional open drain output circuit 100, which is shown by a broken line in FIG. 7.

(2) The time width of the output signal Vout at an H level is shortened. This decreases the difference between the time width at an H level and the time width at an L level.

(3) After the output transistor Tr3 is turned ON, the transistor Tr4 is turned OFF. Thus, the potential at the node N1 gradually rises with a gradient similar to that for the conventional open drain output circuit 100. The gradient for the fall of the output signal Vout is thus maintained so as to comply with the standard of the I²C bus interface.

(4) The difference between the time width at an H level and the time width at an L level for the output signal Vout is reduced with a simple configuration, in which the resistor R3 and the transistor Tr4 are just added.

Figure 8:
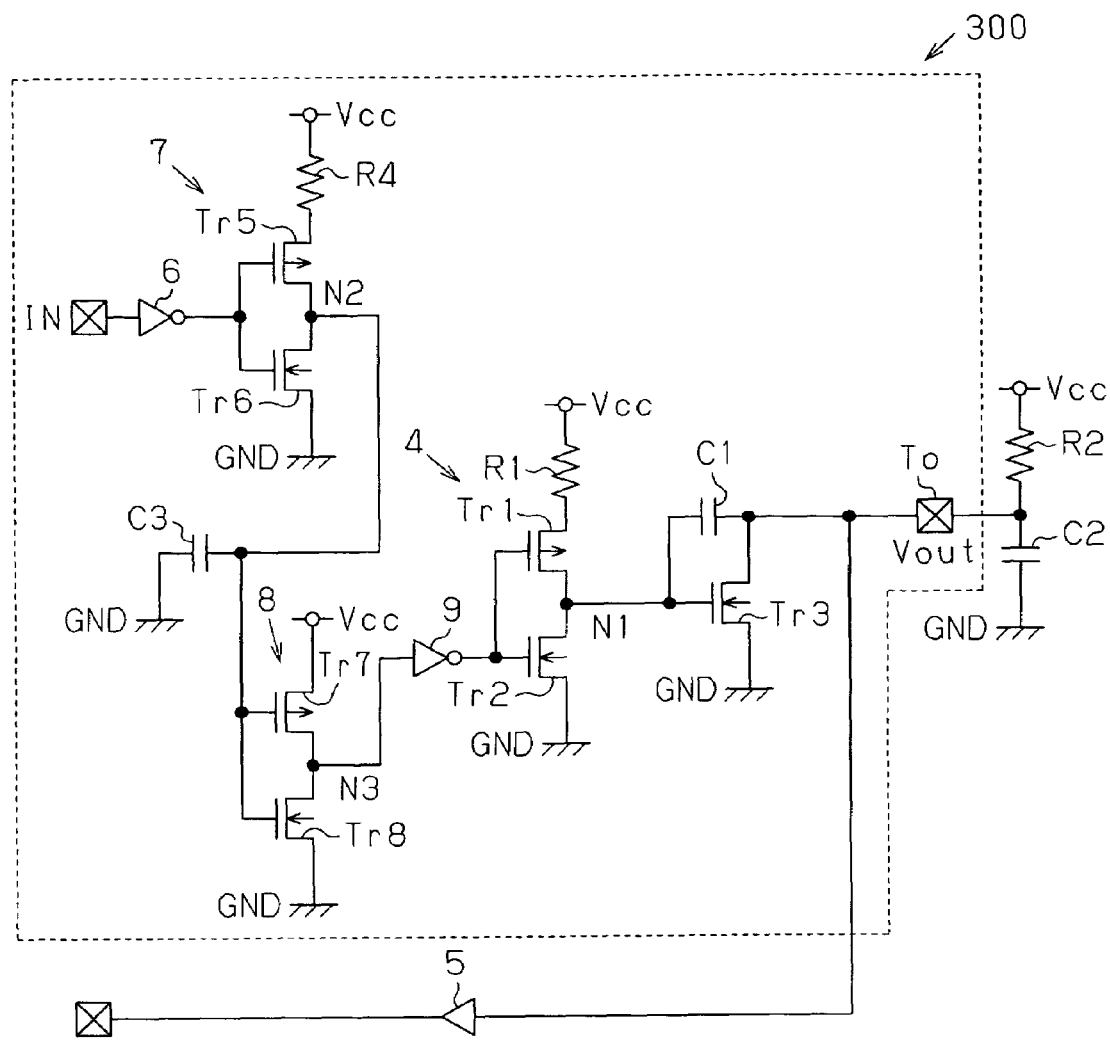
FIG. 8 is a schematic circuit diagram showing an open drain output circuit according to a second embodiment of the present invention.

FIG. 8 shows an open drain output circuit 300 according to a second embodiment of the present invention. The open drain output circuit 300 of the second embodiment has the configuration of the conventional open drain output circuit 100 shown in FIG. 3. In addition, the open drain output circuit 300 includes a second delay time adjustment circuit for delaying the rise of the output signal Vout and reducing the difference between the time width of an H level and the time width of an L level of the output signal Vout.

The input signal IN is provided to the gates of transistors Tr5 and Tr6, which form a second inverter circuit 7, via a first inverter circuit 6. The transistor Tr5 has a source connected to the power supply Vcc via the resistor R4. The transistor Tr6 has a source connected to the ground GND.

The output node N2 of the inverter circuit 7 is connected to the ground GND via a capacitor C3 and connected to the gates of transistors Tr7 and Tr8, which configure a third inverter circuit 8. The resistance of the resistor R4 is set to be high, or substantially the same as the resistance of the resistor R1. The capacitance of the capacitor C3 is set to be the same as that of the capacitor C1.

The transistor Tr7 has a source connected to the power supply Vcc. The transistor Tr8 has a source connected to the ground GND.

The output node N3 of the inverter circuit 8 is connected to the gates of the transistors Tr1 and Tr2 via a fourth inverter circuit 9.

Figure 9:
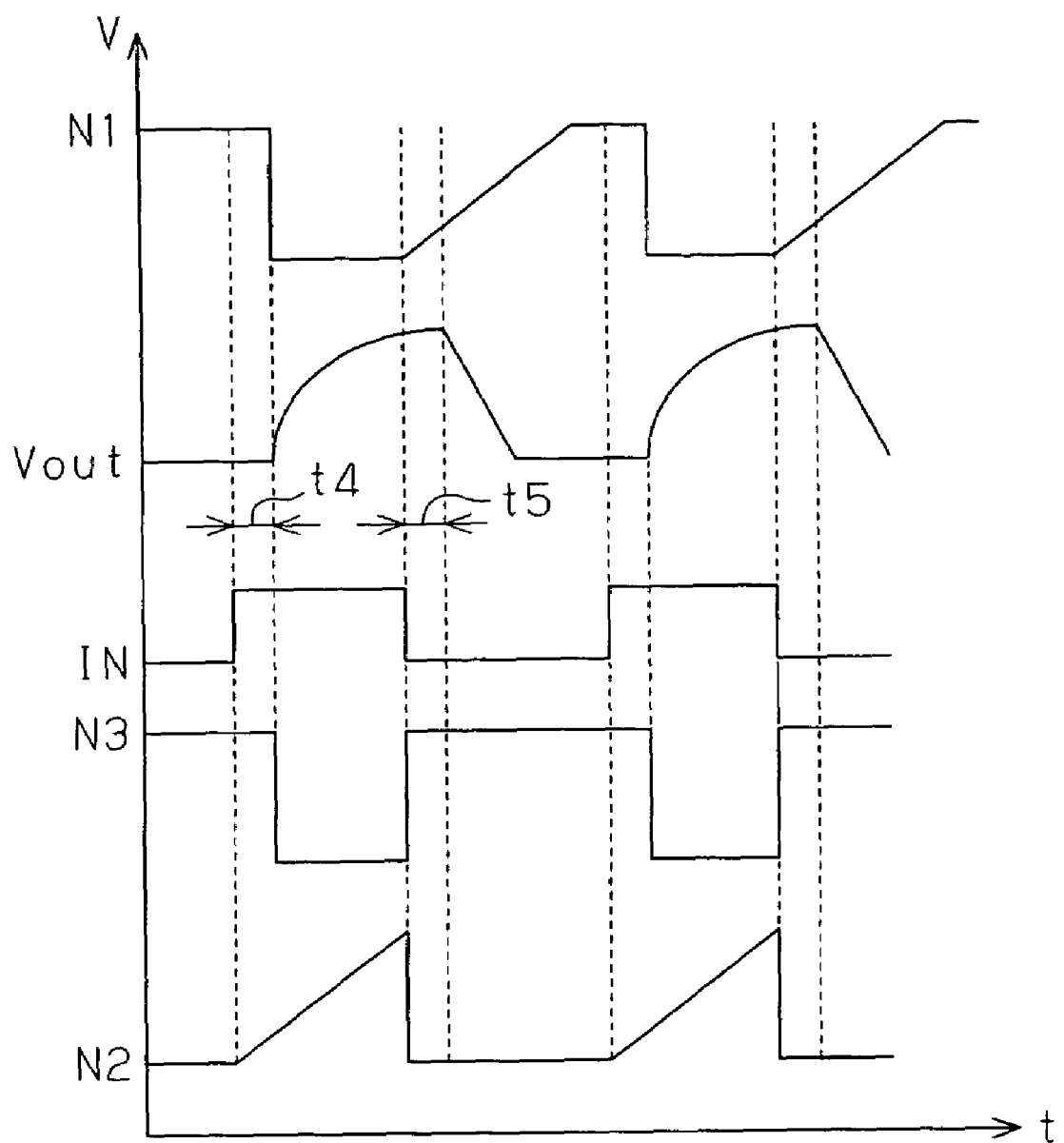
FIG. 9 is a timing waveform chart showing the operation of the open drain output circuit in the second embodiment.

The operation of the open drain output circuit 300 will now be described with reference to FIG. 9. When the input signal IN rises from an L level to an H level, a signal having an L level is provided to the gates of the transistors Tr5 and Tr6.

The drain current of the transistor Tr5 is then limited by the resistor R4 and the capacitor C3 is charged by this drain current. Thus, the potential at the node N2 gradually rises. The potential at the node N3 then falls to an L level due to the operation of the inverter circuit 8 after delay time t4 elapses from the rise of the input signal IN. Therefore, the resistor R4 and the capacitor C3 form a time constant circuit for dampening the rise of the potential at the node N2.

When the potential at the node N3 falls to an L level, the output signal of the inverter circuit 9 rises to an H level, and the potential at the node N1 becomes an L level. This turns OFF the output transistor Tr3 and sets the output terminal To to the high impedance state. As a result, the output signal Vout gradually rises from an L level to an H level in accordance with the time constant determined by the terminal resistor R2 and the bus capacitor C2.

Therefore, the output signal Vout starts to rise after delay time t4 elapses from the rise of the input signal IN.

When the input signal IN falls from an H level to an L level, the output signal of the inverter circuit 6 rises to an H level and turns ON the transistor Tr6. This discharges the capacitor C3 with the drain current and the potential at the node N2 becomes an L level.

The potential at the node N3 then rises to an H level, and the output signal of the inverter circuit 9 falls to an L level. Further, the drain current limited by the transistor Tr1 gradually raises the potential at the node N1.

When the potential at the node N1 reaches the threshold value of the output transistor Tr3 after delay time t5 elapses from when the potential at the node N1 starts to rise, the output transistor Tr3 is turned ON. Further, as the potential at the node N1 rises, the drain current of the output transistor Tr3 gradually increases, and the level of the output signal Vout gradually lowers. In such operation, the time constant circuit is set so that the delay times t4 and t5 become substantially the same.

The open drain output circuit 300 of the second embodiment has the advantages described below.

(1) The delay time t4 from the rise of the input signal IN to the start of rise of the output signal Vout is set so as to be substantially the same as the delay time t5 from the fall of the input signal IN to the start of fall of the output signal Vout. Therefore, the time width of an H level of the output signal Vout becomes substantially the same as the time width of an L level when the time width of an H level of the input signal IN is substantially the same as the time width of an L level.

Figure 10:
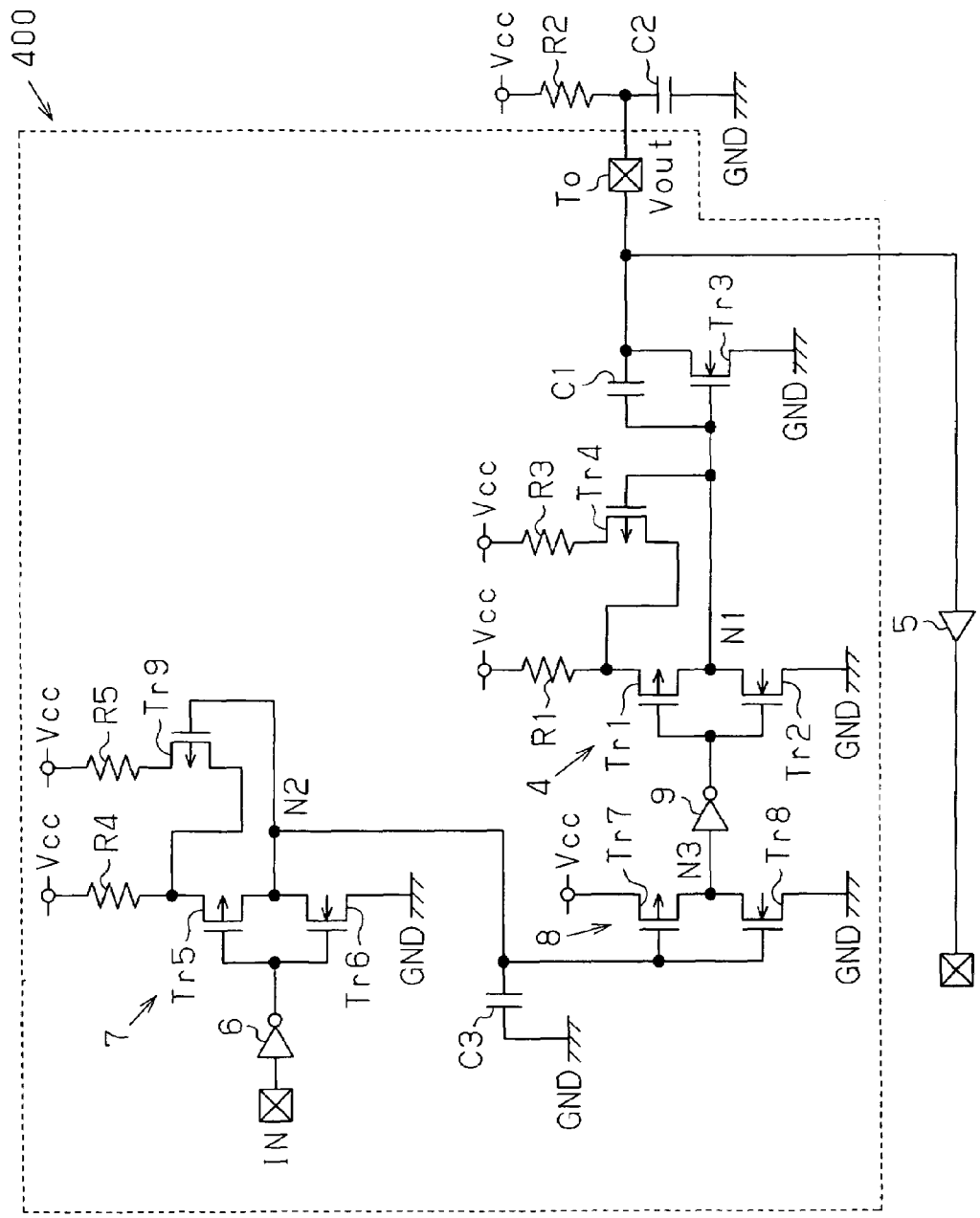
FIG. 10 is a schematic circuit diagram showing an open drain output circuit according to a third embodiment of the present invention.

FIG. 10 shows an open drain output circuit 400 according to a third embodiment of the present invention. The open drain output circuit 400 of the third embodiment has the configurations of the open drain output circuit 200 of the first embodiment and the open drain output circuit 300 of the second embodiment. In addition, the open drain output circuit 400 includes a resistor R5 and a transistor Tr9 (P-channel MOS transistor).

The transistor Tr9 has a source connected to the power supply Vcc via the resistor R5 and a drain connected to the source of the transistor Tr5. The resistance of the resistor R5 is set to be sufficiently smaller than the resistance of the resistor R4.

Figure 11:
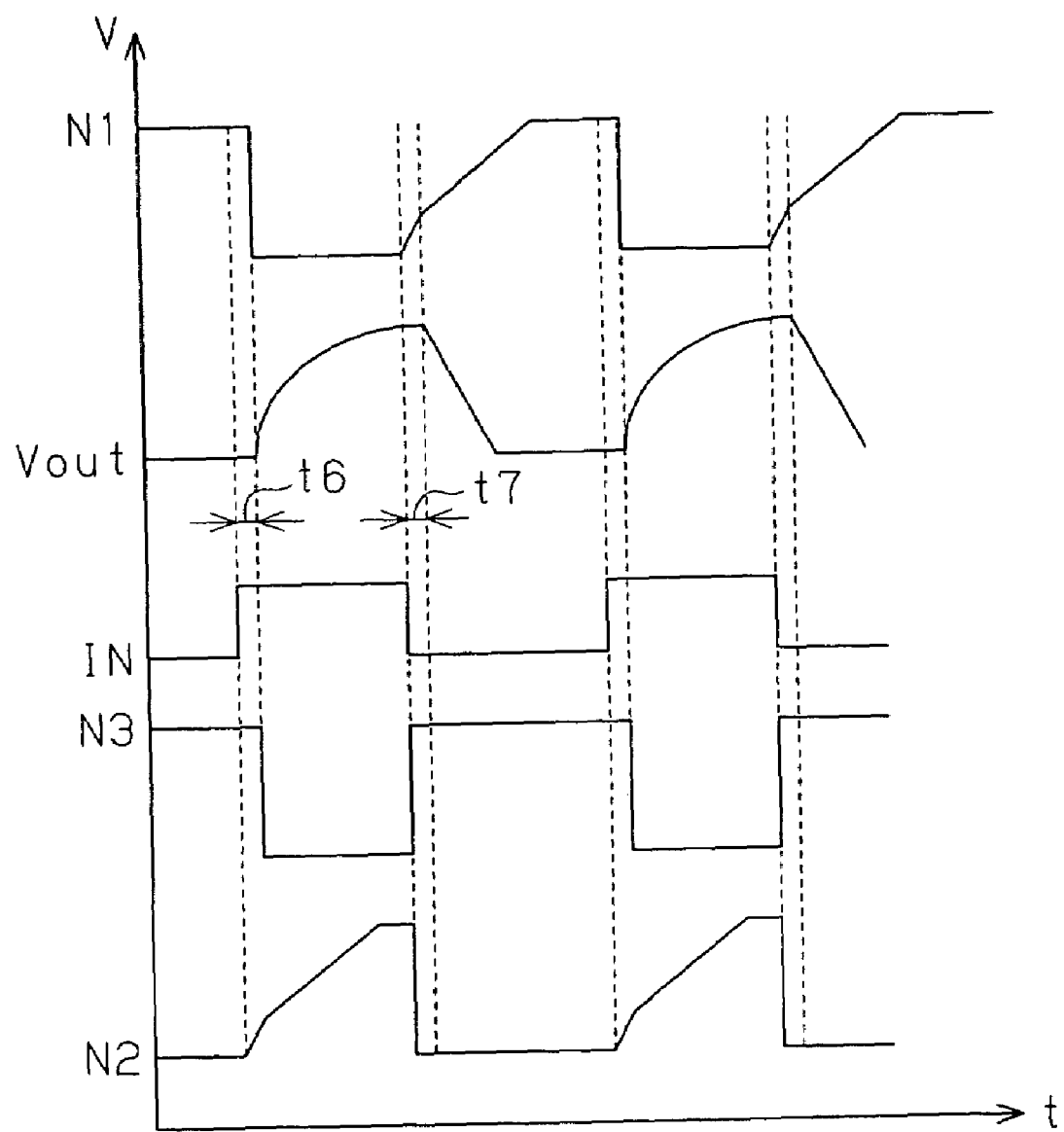
FIG. 11 is a timing waveform chart showing the operation of the open drain output circuit in the third embodiment.

The operation of the open drain output circuit 400 will now be described with reference to FIG. 11. When the input signal IN rises from an L level to an H level, a signal having an L level is provided to the gates of the transistors Tr5 and Tr6.

As a result, the transistor Tr5 is turned ON. Further, since the potential at the node N2 is so far at an L level, the transistor Tr9 is turned ON. The capacitor C3 is charged by the current supplied from the transistor Tr9 to the transistor Tr5, and the potential at the node N2 rises relatively steeply.

The rise in the potential at the node N2 turns OFF the transistor Tr9. Further, the capacitor C3 is charged only by the drain current limited by the transistor Tr5, and the potential at the node N2 gradually rises.

In accordance with the rise of the potential at the node N2, the operation of the inverter circuit 8 causes the potential at the node N3 to fall to an L level after delay time t6 elapses from the rise of the input signal IN.

When the potential at the node N3 falls to an L level, the output signal of the inverter circuit 9 rises to an H level, and the potential at the node N1 falls to an L level. The output transistor Tr3 is then turned OFF and the output terminal To is set to a high impedance state. Thus, the output signal Vout generated at the output terminal To gradually rises from an L level to an H level in accordance with the time constant determined by the terminal resistor R2 and the bus capacitor C2.

In this state, the transistor Tr4 is turned ON. However, the drain current of the transistor Tr4 is not supplied to the node N1 since the transistor Tr1 of the inverter circuit 4 is turned OFF.

Therefore, the output signal Vout starts to rise after delay time t6 elapses from the rise of the input signal IN.

When the input signal IN falls from an H level to an L level, the output signal of the inverter circuit 6 rises to an H level and the transistor Tr6 is turned ON. The capacitor C3 is discharged by the drain current and the potential at the node N2 becomes an L level. In this state, the transistor Tr9 is turned ON. However, the drain current of the transistor Tr9 is not supplied to the node N2 since the transistor Tr5 of the inverter circuit 7 is turned OFF.

When the potential at the node N2 becomes an L level, the potential at the node N3 rises to an H level and the output signal of the inverter circuit 9 falls to an L level. The transistor Tr1 is then turned ON, the drain current of the transistor Tr4 is supplied to the node N1 via the transistor Tr1, and the potential at the node N1 rises relatively steeply.

When the potential at the node N1 reaches the threshold value of the output transistor Tr3 after delay time t7 from the start of rise of the potential at the node N1, the output transistor Tr3 is turned ON, the drain current of the output transistor Tr3 gradually increases as the potential at the node N1 rises, and the output signal Vout is gradually lowered. In such operation, the delay time t6 is substantially the same as the delay time t7.

The transistor Tr4 is turned OFF at substantially the same timing as when the output transistor Tr3 is turned ON. Therefore, after the transistor Tr4 is turned OFF, the potential at the node N1 gradually rises based on the drain current of the transistor Tr1, the drain current of the output transistor Tr3 increases, and the output signal Vout gradually falls from an H level to an L level.

The open drain output circuit 400 of the third embodiment has the advantages described below.

(1) The delay time t6 from the rise of the input signal IN to when the output signal Vout starts to rise is set so as to be substantially the same as the delay time t7 from the fall of the input signal IN to when the output signal Vout starts to fall. Therefore, for the output signal Vout, the time width at an H level becomes substantially the same as the time width at an L level when the input signal IN has substantially the same time widths at an H level and an L level.

(2) The delay times t6 and t7 are set to be smaller compared to when the open drain output circuit 300 of the second embodiment is used. Therefore, the response of the output signal Vout with respect to the input signal IN is improved compared to when using the open drain output circuit 300 of the second embodiment.

Figure 12:
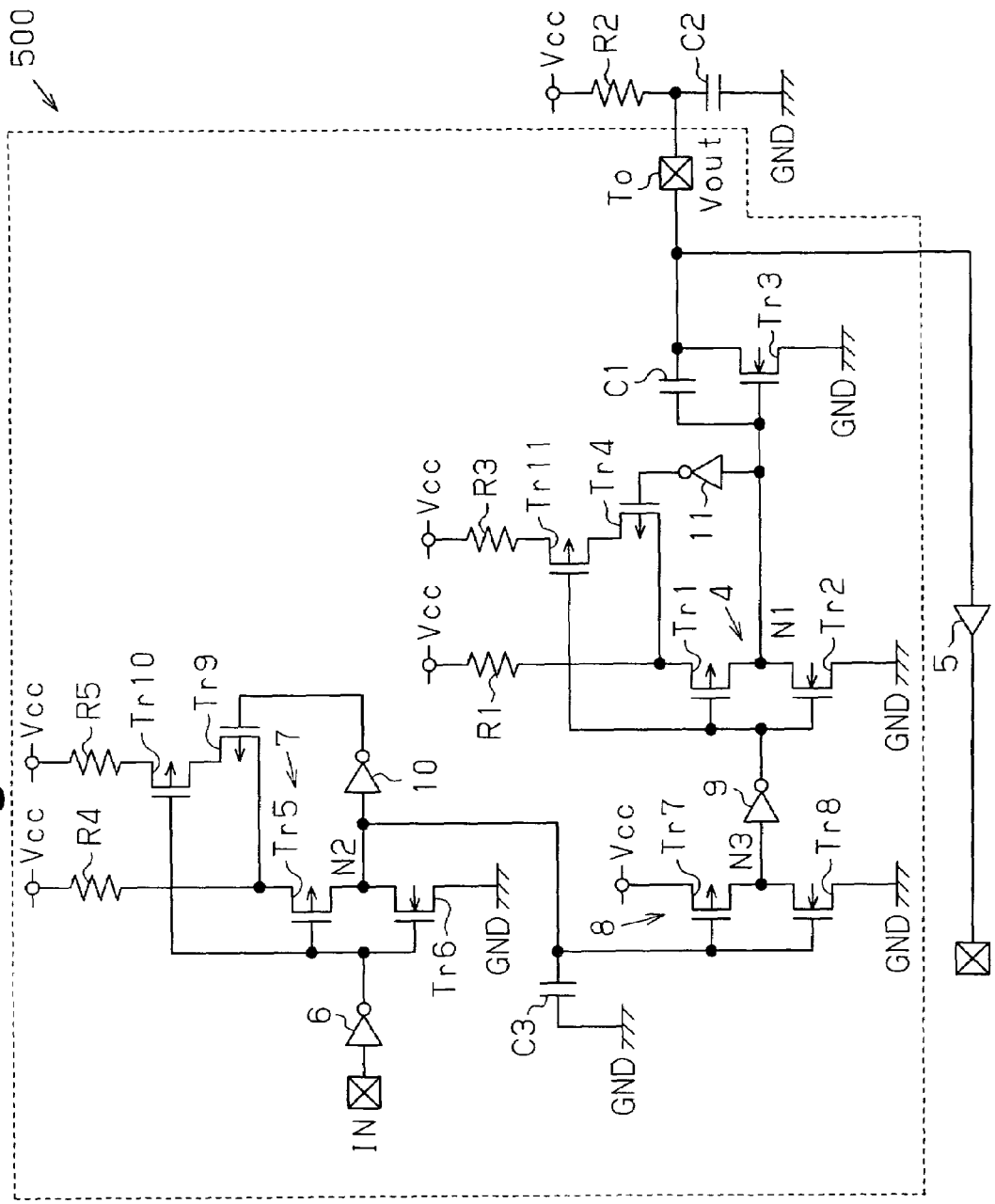
FIG. 12 is a schematic circuit diagram showing an open drain output circuit according to a fourth embodiment of the present invention.

FIG. 12 shows an open drain output circuit 500 according to a fourth embodiment of the present invention. The open drain output circuit 500 of the fourth embodiment includes the open drain output circuit 400 of the third embodiment in addition to transistors Tr10 and Tr11 (P-channel MOS transistors) and inverter circuits 10 and 11 which function as an output node adjustment circuit or a second current supply circuit.

The transistor Tr10 is connected between the resistor R5 and the transistor Tr9. The output signal of the inverter circuit 6 is provided to the gate of the transistor Tr10. An inverted potential generated by inverting the potential at the node N2 at the inverter circuit 10 is provided to the gate of the transistor Tr9.

The transistor Tr11 is connected between the resistor R3 and the transistor Tr4. The output signal of the inverter circuit 9 is provided to the gate of the transistor Tr11. The inverted potential generated by inverting the potential at the node N1 at the inverter circuit 11 is provided to the gate of the transistor Tr4.

Figure 13:
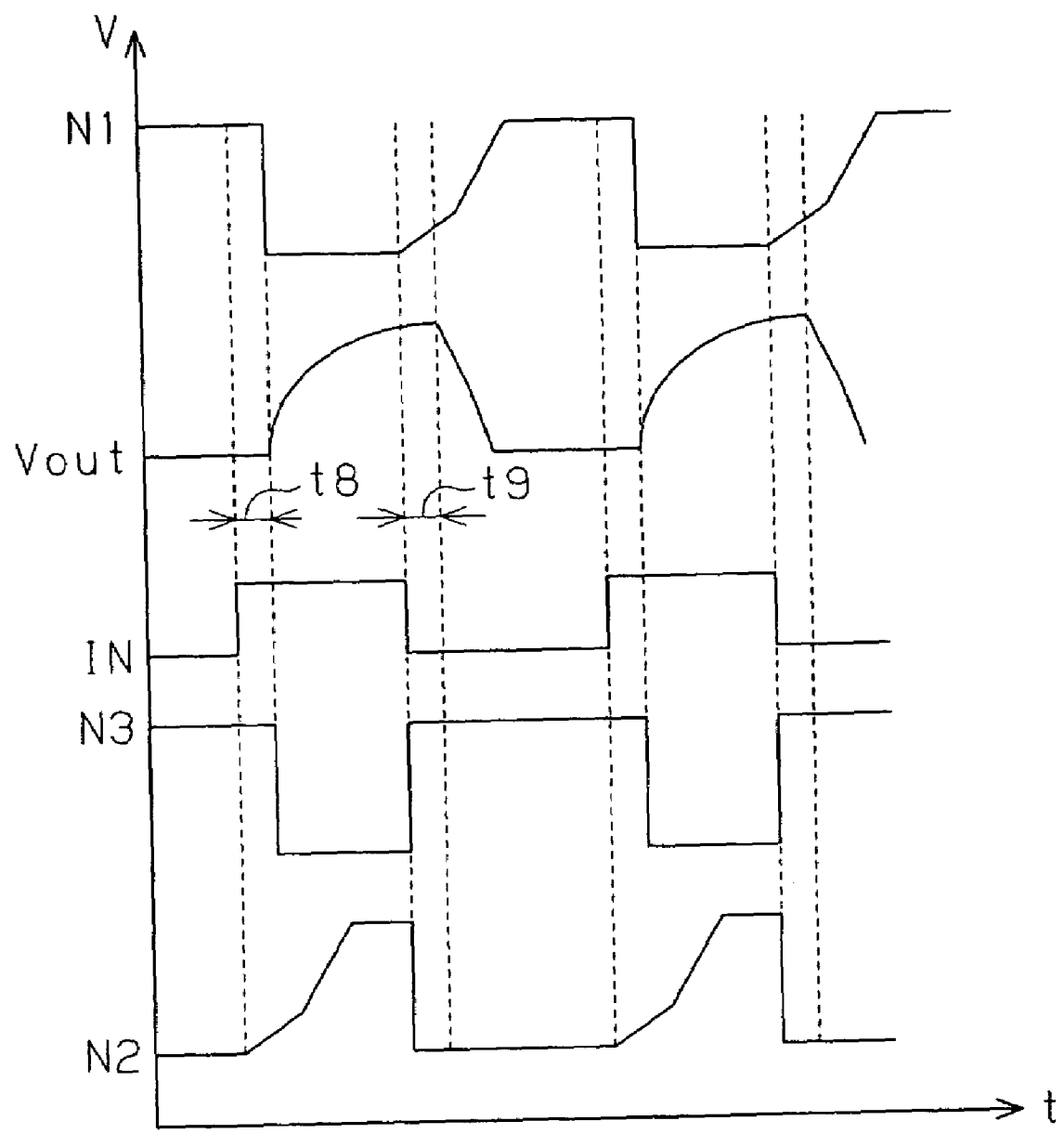
FIG. 13 is a timing waveform chart showing the operation of the open drain output circuit in the fourth embodiment.

The operation of the open drain output circuit 500 will now be described with reference to FIG. 13. As the input signal IN rises from an L level to an H level, the signal of an L level is provided to the gates of the transistors Tr5 and Tr6.

The transistors Tr5 and Tr10 are then turned ON. The potential at the node N2 gradually rises by the drain current of the transistor Tr5 restricted by the resistor R4. When the output signal of the inverter circuit 10 falls to an L level due to the rise in the potential at the node N2, the transistor Tr9 is turned ON. Further, the drain current of the transistor Tr9 set by the resistor R5 is supplied to the node N2 via the transistor Tr5, and the potential at the node N2 rises relatively steeply.

When the potential at the node N2 rises, the operation of the inverter circuit 8 causes the potential at the node N3 to fall to an L level after delay time t8 elapses from the rise of the input signal IN.

When the potential at the node N3 falls to an L level, the output signal of the inverter circuit 9 becomes an H level and the potential at the node N1 becomes an L level. This turns OFF the output transistor Tr3 and the output terminal To is set to the high impedance state. Thus, the output signal Vout generated at the output terminal To gradually rises from an L level to an H level in accordance with the time constant determined by the terminal resistor R2 and the bus capacitor C2. In this state, the transistors Tr1, Tr4, and Tr11 are turned OFF.

Therefore, the output signal Vout starts to rise after delay time t8 elapses from the rise of the input signal IN.

When the input signal IN falls from an H level to an L level, the output signal of the inverter circuit 6 rises to an H level and the transistor Tr6 is turned ON. The capacitor C3 is discharged by the drain current and the potential at the node N2 falls to an L level. In this state, the transistors Tr5, Tr9, and Tr10 are turned OFF.

When the potential at the node N2 falls to an L level, the potential at the node N3 rises to an H level, and the output signal of the inverter circuit 9 falls to an L level. The transistors Tr1 and Tr11 are then turned ON. The potential at the node N1 gradually rises due to the drain current of the transistor Tr1 restricted at the resistor R1. When the output signal of the inverter circuit 11 falls to an L level due to the rise in the potential at the node N1, the transistor Tr4 is turned ON, the drain current of the transistor Tr4 set at the resistor R3 is supplied to the node N1 via the transistor Tr1, and the potential at the node N1 rises relatively steeply.

When the potential at the node N1 reaches the threshold value of the transistor Tr3 after delay time t9 elapses from when the potential at the node N1 starts to rise, the output transistor Tr3 is turned ON, the drain current of the output transistor Tr3 gradually increases as the potential at the node N1 rises, and the output signal Vout is gradually lowered. In such operation, the delay time t8 is substantially the same as the delay time t9.

When the rise speed of the potential at the node N1 becomes steep, the drain current of the output transistor Tr3 increases, and the fall of the output signal Vout becomes steep.

The open drain output circuit 500 of the fourth embodiment has the advantages described above.

(1) When the output signal Vout falls, the output signal Vout first starts to gradually fall and then falls relatively steeply. This ensures that the falling characteristic of the output signal Vout satisfies the I$^2$C bus interface standard, and increases the fall speed of the output signal Vout.

(2) The delay time t8 from the rise of the input signal IN to the start of rise of the output signal Vout is set so as to be substantially the same as the delay time t9 from the fall of the input signal IN to the start of fall of the output signal Vout. Therefore, when the time widths at an H level and an L level are substantially the same for the input signal IN, the time widths for an L level and an H level are substantially the same for the output signal Vout.

It should be apparent to those skilled in the art that the present invention may be embodied in many other specific forms without departing from the spirit or scope of the invention. Particularly, it should be understood that the present invention may be embodied in the following forms.

In the open drain output circuits of the first to fourth embodiments, the circuit for adjusting the current supplied to the node N1 or the node N2 may be a circuit other than that configured by the P-channel MOS transistor and the resistor.

The present examples and embodiments are to be considered as illustrative and not restrictive, and the invention is not to be limited to the details given herein, but may be modified within the scope and equivalence of the appended claims.

What is claimed is:

1. An open drain output circuit including an output terminal, the open drain output circuit comprising:
   an input unit for receiving an input signal, wherein the input unit includes an output node and performs a first operation and a second operation in accordance with transition of the input signal, the first operation causing potential at the output node to steeply fall and the second operation causing the potential at the output node to gradually rise; and
   an output transistor having a gate connected to the output node of the input unit and a drain connected to the output terminal, the output transistor being turned OFF in the first operation of the input unit and being turned ON in the second operation;
   wherein the input unit includes:
   a first inverter circuit for driving an output signal originating from the input signal at the output node of the input unit; and
   a delay time adjustment circuit for reducing the difference between a delay time from the transition of the input signal until when the output transistor is turned OFF in the first operation and a delay time from the transition of the input signal until when the output transistor is turned ON in the second operation,
   wherein the delay time adjustment circuit includes a first transistor having a gate directly connected to an internal node between the output node of the input unit and the gate of the output transistor, and a drain connected to the first inverter circuit.

2. The open drain output circuit according to claim 1, wherein the delay time adjustment circuit includes a first delay time adjustment circuit for shortening the delay time from the transition of the input signal until the output transistor is turned ON in the second operation, and wherein the first delay time adjustment circuit includes the first transistor.

3. The open drain output circuit according to claim 2, wherein the first delay time adjustment circuit includes a first current supply circuit for supplying current to the output node via the first inverter circuit when the potential at the output node of the input unit starts to rise, and wherein the first current supply circuit includes the first transistor.

4. The open drain output circuit according to claim 3, wherein the first current supply circuit further includes:
   a first resistor connected between a source of the first transistor and a power supply.

5. An open drain output circuit including an output terminal, the open drain output circuit comprising:
   an input unit for receiving an input signal, wherein the input unit includes an output node and performs a first operation and a second operation in accordance with transition of the input signal, the first operation causing potential at the output node to steeply fall and the second operation causing the potential at the output node to gradually rise; and
   an output transistor having a gate connected to the output node of the input unit and a drain connected to the output terminal, the output transistor being turned OFF in the first operation of the input unit and being turned ON in the second operation;
   wherein the input unit includes a delay time adjustment circuit for reducing the difference between a delay time from the transition of the input signal until when the output transistor is turned OFF in the first operation and a delay time from the transition of the input signal until when the output transistor is turned ON in the second operation, and
   wherein the delay time adjustment circuit includes a second delay time adjustment circuit for extending the delay time from the transition of the input signal until when the output transistor is turned OFF in the first operation.

6. The open drain output circuit according to claim 5, wherein:
   the input unit includes a first inverter circuit for driving an output signal of the output node of the input unit; and
   the second delay time adjustment circuit includes:
   a second inverter circuit for receiving the input signal and generating a first output signal;
   a time constant circuit for receiving the first output signal of the second inverter circuit, the time constant circuit generating a second output signal that gradually rises in the first operation;
   a third inverter circuit for receiving the second output signal of the time constant circuit and generating a third output signal; and
   a fourth inverter circuit for inverting the third output signal of the third inverter circuit to generate a fourth output signal, the fourth inverter circuit providing the fourth output signal to the first inverter circuit.

7. The open drain output circuit according to claim 6, wherein the time constant circuit includes:
   a fifth inverter circuit for receiving the first output signal of the second inverter circuit;
   a second resistor connected between the fifth inverter circuit and a power supply; and
   a capacitor connected between the inverter output node of the fifth inverter circuit and ground.

8. An open drain output circuit including an output terminal, the open drain output circuit comprising:
   an input unit for receiving an input signal, wherein the input unit includes an output node and performs a first operation and a second operation in accordance with transition of the input signal, the first operation causing potential at the output node to steeply fall and the second operation causing the potential at the output node to gradually rise; and
   an output transistor having a gate connected to the output node of the input unit and a drain connected to the output terminal, the output transistor being turned OFF in the first operation of the input unit and being turned ON in the second operation;
   wherein the input unit includes a delay time adjustment circuit for reducing the difference between a delay time from the transition of the input signal until when the output transistor is turned OFF in the first operation and a delay time from the transition of the input signal until when the output transistor is turned ON in the second operation, and
   wherein the delay time adjustment circuit includes:
   a first delay time adjustment circuit for shortening the delay time from a transition of the input signal until when the output transistor is turned ON in the second operation; and a second delay time adjustment circuit for extending the delay time from a transition of the input signal until when the output transistor is turned OFF in the first operation.

9. The open drain output circuit according to claim 8, wherein:

the input unit includes a first inverter circuit for driving the output signal of the output node of the input unit;

the first delay time adjustment circuit includes a first current supply circuit for supplying current to the output node via the first inverter circuit when the potential at the output node of the input unit starts to rise; and the second delay time adjustment circuit includes:

a second inverter circuit for receiving the input signal and generating a first output signal;

a time constant circuit for receiving the first output signal of the second inverter circuit, the time constant circuit generating a second output signal that rises relatively steeply in response to the rise of the input signal and then rises gradually;

a third inverter circuit for receiving the second output signal of the time constant circuit and generating a third output signal; and a fourth inverter circuit for inverting the third output signal of the third inverter circuit to generate a fourth output signal, the fourth inverter circuit providing the fourth output signal to the first inverter circuit.

10. The open drain output circuit according to claim 9, wherein:

the first current supply circuit includes:

a first transistor having a gate connected to the output node of the input unit and a drain connected to the first inverter circuit; and a first resistor connected between the source of the first transistor and a power supply; and the time constant circuit includes:

a fifth inverter circuit for receiving the second output signal of the second inverter circuit a second resistor connected between the fifth inverter circuit and the power supply;

a second transistor having a drain connected to a node between the fifth inverter circuit and the second resistor and a gate connected to an inverter output node of the fifth inverter circuit;

a third resistor connected between the source of the second transistor and the power supply; and a capacitor connected between the inverter output node of the fifth inverter circuit and the ground.

11. The open drain output circuit according to claim 1, wherein the input unit includes an output node adjustment circuit for accelerating the speed at which the potential at the output node of the input unit rises after a predetermined time elapses from when the input unit starts the second operation.

12. The open drain output circuit according to claim 11, wherein the output node adjustment circuit includes a second current supply circuit for accelerating the speed at which the potential at the output node of the input unit rises after the predetermined time elapses.

13. The open drain output circuit according to claim 12, the second current supply circuit includes:

a sixth inverter circuit connected to the output node of the input unit;

a third transistor having a gate connected to an inverter output node of the sixth inverter circuit and a drain connected to the first inverter circuit;

a fourth transistor having a drain connected to a source of the third transistor and a gate connected to an input node of the first inverter circuit, and a first resistor connected between a source of the fourth transistor and a power supply.

* * * * *